United States Patent [19]

Koch

[11] Patent Number: 5,394,489
[45] Date of Patent: Feb. 28, 1995

[54] WAVELENGTH DIVISION MULTIPLEXED OPTICAL COMMUNICATION TRANSMITTERS

[75] Inventor: Thomas L. Koch, Holmdel, N.J.

[73] Assignee: AT&T Corp., Murray Hill, N.J.

[21] Appl. No.: 97,692

[22] Filed: Jul. 27, 1993

[51] Int. Cl.[6] .................. G02B 6/12; H04J 14/00; H01S 3/19

[52] U.S. Cl. .................. 385/14; 385/2; 385/8; 385/9; 385/24; 385/31; 385/45; 385/46; 385/49; 385/130; 385/132; 372/50; 372/96; 372/97; 359/115; 359/124; 359/127; 359/181; 359/188

[58] Field of Search .............. 385/1, 2, 3, 8, 9, 14, 385/24, 27, 30, 31, 37, 39, 44, 45, 46, 49, 50, 88, 89, 129, 130, 131, 132; 372/6, 7, 43, 50, 97, 96; 359/115, 124, 127, 180, 181, 188, 195

[56] References Cited

U.S. PATENT DOCUMENTS

| | | | |
|---|---|---|---|
| 5,109,447 | 4/1992 | Chan | 385/49 X |
| 5,115,444 | 5/1992 | Kirkby et al. | 372/50 |
| 5,134,672 | 7/1992 | Imoto et al. | 385/16 |
| 5,228,103 | 7/1993 | Chen et al. | 385/14 |
| 5,282,260 | 1/1994 | Buchal et al. | 385/130 X |
| 5,305,412 | 4/1994 | Paoli | 372/50 X |
| 5,311,604 | 5/1994 | Rogner et al. | 385/14 |
| 5,341,444 | 8/1994 | Henry et al. | 385/14 X |

OTHER PUBLICATIONS

"Wavelength division multiplexing light source with integrated quantum well tunable lasers and optical amplifiers", by U. Koren, et al, in *Applied Physics Letters*, 54 (21) of 22 May 1989 published by the American Institute of Physics, p. 2056, on.

"Integration of A Multiwavelength Compressive-Strained Multi-Quantum-Well Distributed-Feedback Laser Array With A Star Coupler and Optical Amplifiers", by C. E. Zah et al., paper No. K1, in *Tech. Digest*, 13th IEEE, Int. Semiconductor Laser Conf., Kagawa Japan, p. 194 on, in 1992.

"Efficient N×N Star Couplers Using Fourier Optics" by C. Dragone in the *Journal of Lightwave Technology*, vol. 7, No. 3, Mar. 1989, p. 479 et seq.

M. Zirngibl et al., entitled "Efficient 1×16 Optical Power Splitter Based on InP" in *Electronics Letters of 18 Jun. 1992*, vol. 8, No. 13, p. 1212 et seq.

The publication "8 Wavelength DBR Laser Array Fabricated with a Single Step Bragg Grating Printing Technique" by J. M. Verdiell et al. in *IEEE Photonics Technology Letters*, vol. 5, No. 6, of Jun. 1993, p. 619 et seq.

"Semiconductor Photonic Integrated Circuits" by Thomas L. Koch et al, in the *IEEE Journal of Quantum Electronics*, vol. 27, No. 3, of Mar. 1991.

"Semiconductor Lasers For Coherent Optical Fiber Communications" by Thomas L. Koch et al., in the *Journal of Lighwave Technology*, vol. 8, No. 3, of Mar. 1990, p. 274.

"A Frequency Multiplexing Light Source With Monolithically Integrated Distributed Feedback Diode Lasers" by K. Aiki et seq., in the *IEEE Journal of Quantum Electronics*, vol. QE-13 No. 4 of Apr. 1977.

"Four Channel WDM Transmission Experiment Using Photonic-Integrated-Circuit Transmitter" by A. H. Gnauck et seq., No. PD26 in *Tech. Digest of Optical Fiber Communications Conference*, San Francisco, 1990.

*Primary Examiner*—Brian Healy

[57] ABSTRACT

A wavelength-division-multiplexed transmitter has a single modulator modulating the output of an array of individually actuable semiconductor lasers integrated onto the same substrate as the modulator. An optical combiner integrated onto the same substrate between each of the lasers and the single modulator combines the outputs of the lasers. One or more of the lasers are activated as desired for wavelength division multiplexing.

18 Claims, 3 Drawing Sheets

WAVELENGTH DIVISION MULTIPLEXED OPTICAL COMMUNICATION TRANSMITTERS

FIELD OF THE INVENTION

This invention relates to optical communications, and particularly to wavelength-division multiplexing (WDM) transmitters.

BACKGROUND OF THE INVENTION

The use of wavelength division multiplexing affords one the opportunity of raising the transmission capacity of a single fiber without the need to develop higher speed components. In switching or networking environments, wavelength division multiplexing arrangements permits optical routing of signals at different wavelengths to different destinations.

Optical sources used in wavelength division multiplexed communications systems must generate light at controlled wavelengths. They require means either to set them permanently to a desired wavelength allocated to a particular channel, or to switch them dynamically to different specific wavelengths for routing purposes. In general, the sources must restrict the wavelengths to prescribed spaced values so that signals do not interfere with each other. Such interference may result from the nonlinear transmission properties of the fiber itself, or from source wavelength drift and insufficient out-off band rejection in the optical filtering or heterodyning technology used to demultiplex the signals at the receiver.

Discrete fixed-frequency sources have been used in wavelength division multiplexing demonstrations. However, using such systems on a commercial basis requires the storage and maintenance of large numbers of reserve sources such as distributed feedback (DFB) lasers. Tunable lasers that attempt to cover the entire range of desired wavelengths have hitherto required cumbersome feedback from external references to provide reliable wavelength stability and often have had insufficient tuning range for many applications.

The paper "A 16×1 WDM Transmitter with Integrated DBR Lasers and Electroabsorption Modulators" by M. G. Young et al, paper No. IWA3 in *Tech. Digest of 1993 Topical Meeting on Integrated Photonics Research*, pp. 414–417, held in Palm Springs, 1993, discloses the use of an array of sixteen independent distributed Bragg reflector (DBR) lasers, each with an integrated electroabsorption modulator, followed by a combiner and an integrated optical booster amplifier, to provide a single fiber port for all 16 wavelength division multiplexed channels. It requires a modulator for each laser. Such an approach demands complex electrical packaging because the arrangement requires a separate high-speed electrical drive capability for each source, either to modulate each laser directly, or to drive each electroabsorption modulator for each laser.

An object of the invention is to improve wavelength-division-multiplexed systems generally.

Another object of the invention is to improve wavelength-division-multiplexed transmitters.

Yet another object of the invention is to overcome the aforementioned difficulties.

SUMMARY OF THE INVENTION

According to a feature of the invention, these objects are attained, in whole or in part, by merging the output ends of a plurality of individually actuable semiconductor lasers integrated onto a substrate with an optical combiner integrated onto the substrate, and passing the output of the combiner to a single laser modulator also integrated onto the same substrate.

According to another feature of the invention, the lasers are fixed frequency lasers each tuned to a specific frequency.

The invention utilizes but a single modulator to encode any activated one of or several activated ones of the lasers.

These and other features of the invention are pointed out in the claims. Other objects and advantages of the invention will become evident from the following detailed description when read in light of the accompanying drawings.

DETAILED DESCRIPTION OF PREFERRED EMBODIMENTS

Figure 1:
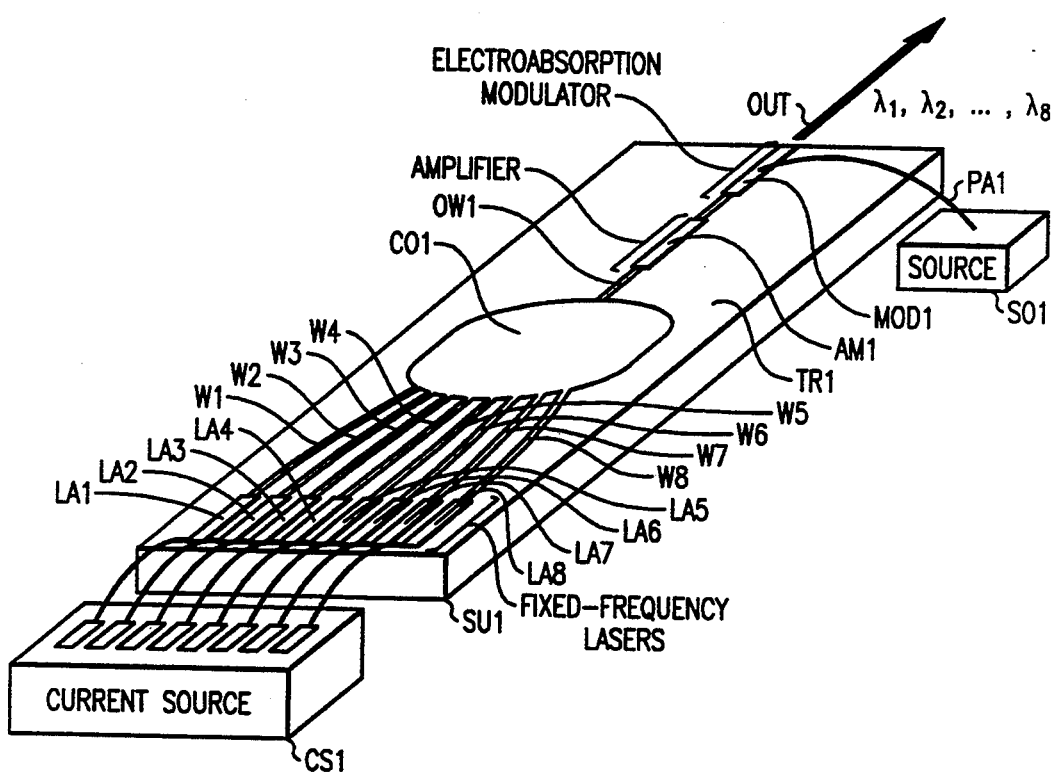
FIG. 1 is a perspective, somewhat schematic, and somewhat block diagram of a wavelength division multiplex arrangement embodying features of the invention.

FIG. 1 illustrates a transmitting arrangement with a single-chip monolithic wavelength division multiplexing transmitter TR1 embodying features of the invention. Here, eight fixed frequency lasers LA1 to LA8 grown, fabricated, or otherwise integrated onto a substrate SU1, operate at respectively different wavelengths $\lambda 1$ to $\lambda 8$. The substrate SU1 is preferably InP but other substrates may be used. Integrated waveguides W1 to W8 grown on, fabricated on, or otherwise integrated onto the substrate SU1 pass the outputs of the lasers LA1 to LA8 to a 8×1 combiner CO1. The optical combiner CO1 passes the outputs of the activated ones of the lasers LA1 to LA8 and illuminates a single output waveguide OW1. An amplifier AM1 amplifies the signal appearing on the fiber OW1. An electroabsorption modulator MOD1 modulates the outputs of the amplifier AM1 and passes it to an output OUT.

According to another embodiment of the invention, the modulator MOD1 is a directional coupler modulator, a Mach-Zehnder modulator, or any other suitable optical modulator. According to another embodiment of the invention, the lasers LA1 to LA8 are distributed Bragg reflector (DBR) lasers or distributed feedback (DFB) lasers. They may be any other form of optical laser having a controlled emission wavelength.

The combiner CO1 is in the form of a slab waveguide region without lateral confinement of the light to allow diffraction in the plane of the wafer. Each waveguide W1 to W8 entering the free-space region on the input sided has a far field that illuminates the output waveguide OW1 on the output side. With one output waveguide, this device is a 1×8 power combiner. In a more general form such combiners have more than one output. With N inputs and N outputs the combiner makes an N x N star coupler. In an embodiment of the invention, the combiner CO1 takes the form of an N x N star coupler and uses only one of the output waveguides.

Combiners, such as combiner CO1, are well known and have been disclosed for Si and SiO2 waveguide technology in the article by C. Dragone, entitled "Efficient N X N Star Couplers Using Fourier Optics" in the *IEEE Journal of Lightwave Tech.* 7, pp. 479–489 (1989), and for InGaAsP/InP waveguide technology in the article by M. Zirngibl et al, entitled "Efficient 1×16 Optical Power Splitter Based on InP", in *Electron Lett.* 28, pp. 1212–1213 (1992). Stated otherwise a combiner such as CO1 is an in-plane diffraction region optically coupled to all the waveguides W1 to W8 and OW1. It can also operate as a splitter. With energy input in one direction from the waveguides W1 to W8 it behaves as a combiner. With energy input at the waveguide OW1 it behaves as a splitter. The combiner CO1 serves to pass energy from the waveguides W1 to W8 to the output waveguide OW1.

Figure 2:
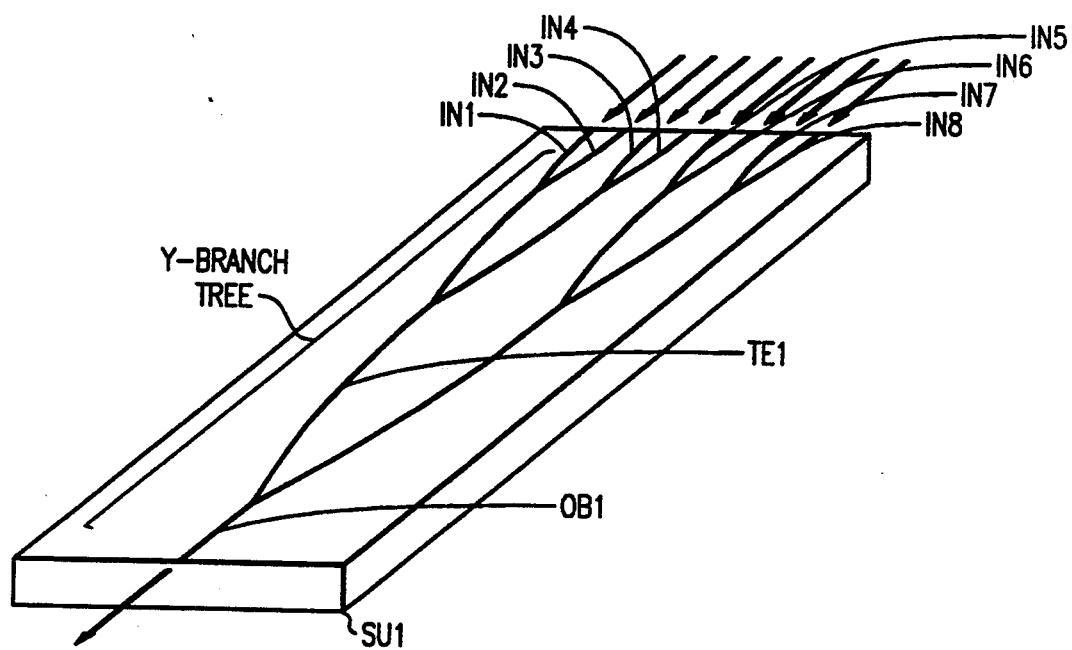
FIG. 2 is a perspective schematic view of a combiner usable according to an embodiment of the invention, in the form of a Y-branch tree.

Another structure that can serve as an 1×8 combiner appears in FIG. 2. Here eight inputs IN1 to IN8 to the branches of a Y-branch tree TE1 combine into one output branch OB1.

To energize the transmitter TR1, a current source CS1 selectively actuates one or more of the eight lasers LA1 to LA8 by applying current to the selected laser or lasers. At the same time a signal source SO1 external to the substrate SU1 furnishes signals to the modulator MOD1 through a path PA1.

In operation, the current source CS1 energizes a laser LA1 to LA8, such as laser LA5 at the wavelength $\lambda 5$, and the corresponding integrated waveguide W1 to W8, namely WI5, passes the output light to the combiner CO1 which illuminates the input of the optical waveguide OW1. The latter passes the light at the selected wavelength $\lambda 5$ to the amplifier AM1, and a modulating signal from the source SO1 causes the modulator MOD1 to modulate the output of the amplifier AM1. Suitable means not shown then transmit the modulated signal to a receiver or other device.

Figure 3:
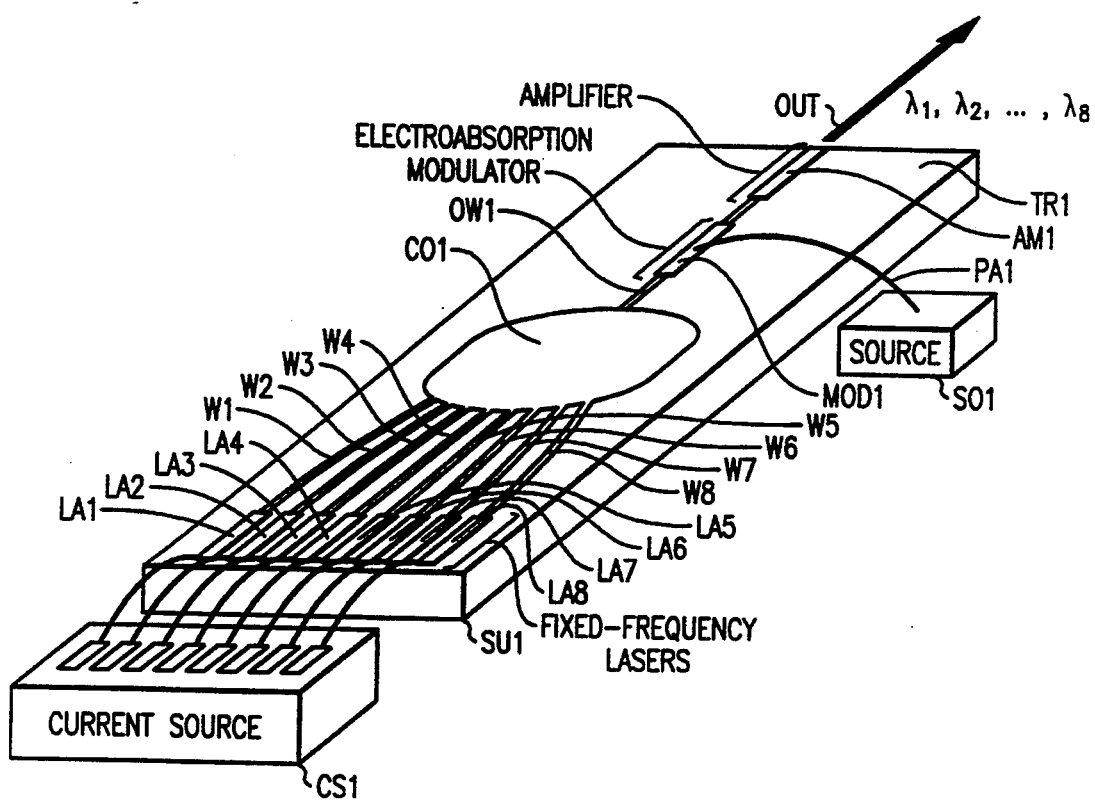
FIG. 3 is a perspective, schematic, and somewhat block diagram of yet another embodiment of the invention shown in FIG. 1.

FIG. 3 illustrates another embodiment of the invention. Here, the structure in FIG. 3 corresponds substantially to the structure of FIG. 1. However, in FIG. 3 the modulator MOD1 precedes the amplifier AM1 in the path from the combiner CO1 to the output OUT. The operation is similar to that of FIG. 1, except that the amplification occurs after modulation.

According to an embodiment of the invention, the elements of FIGS. 1 to 3 are integrated onto or into the substrate SU1 by known crystal growth, photolithographic, thin film deposition, or etching techniques, or combinations of such techniques. The elements may range over the surface of the resulting integrated circuit or may extend on the surface of the substrate SU1 beneath one or more other layers of the integrated circuit. An example of structures made with such techniques, with waveguides beneath one or more layers appears in the article by T. L. Koch et al in the *IEEE Journal of Quantum Electronics,* Volume 27, No. 3, March 1991, entitled "Semiconductor Photonic Integrated Circuits". Other examples of such structures appear in the article by U. Koren et al, in *App. Phys. Lett.* 54 (21), of May 22, 1989 entitled "Wavelength Division Multiplexing Light Source with Integrated Quantum Well Tunable Lasers and Optical Amplifiers". However, the invention is not limited to such means and any suitable known means may be used.

According to another embodiment of the invention lasers responsive to voltages are used. A suitable external voltage energizes the selected voltage responsive lasers.

The present invention achieves the effect of a tunable laser by using an array of fixed frequency lasers combined to a single output port in a single chip. It achieves tuning simply by activating the desired laser. The invention places the modulator after combining the output of each of the lasers in the array in a single combiner CO1. Hence, the transmitter package requires only one high speed drive while maintaining access to all wavelength channels. It achieves the stability inherent in non-tunable lasers. Where dynamic wavelength switching is desired, the switching time is simply the time required to turn off the current to one laser and turn on the current to the new laser. In the examples shown, an array of eight fixed frequency lasers combine to a single output waveguide OW1 where modulation and amplification occur with an integrated modulator and amplifier.

The current source CS1 serves merely to energize one or more lasers LA1 to LA8 and hence to select the wavelength or wavelengths to be used by activating the appropriate laser. Any source that activates the laser or lasers may replace the current source CS1. Each laser LA1 to LA8 in the array can be independently activated any time, in any sequence, or all at once. The laser activation does not contain the high speed coding signal from the source SO1 directed to the modulator MOD1.

The present invention offers the advantages of regaining the wavelength stability that has been demonstrated for fixed frequency distributed feedback lasers. It permits fabrication of arrays of fixed frequency sources with well-controlled wavelength spacings using high-throughput photolithographic printing processes.

According to another embodiment of the invention several or all of the lasers LA1 to LA8 at corresponding wavelengths $\lambda 1$ to $\lambda 8$ are activated. The combiner CO1 illuminates the waveguide OW1 with all the selected wavelengths, and the modulator M modulates the selected wavelengths.

According to still another embodiment of the invention, each of the lasers LA1 to LA8 has some degree of tunability to allow adjustment of each laser to its prescribed frequency. Each laser remains at its tuned frequency during normal operation.

According to yet another embodiment of the invention, the current source actuates the lasers LA1 to LA8 on a time division basis and the combiner CO1 illuminates the output waveguide OW1 at wavelengths $\lambda 1$ to $\lambda 8$ on the same basis. The modulator MOD1 modulates the light at each wavelength on a time division basis with separate signals specific to each wavelength, synchronized in time with the current source CS1. This provides a time-division and wavelength-division multiplex transmitter. In still another embodiment the current source CO1 time division multiplexes one, or any number, of the lasers. The modulator MOD1 modulates the signals in time with the multiplexing of the current source CS1.

The wavelength division multiplexed transmitter TR1 with the architecture according to the invention offers substantial advantages to networks. In a wavelength division multiplexed transmitter network, according to an embodiment of the invention, each transmitter TR1 has a particular wavelength channel allocated to it for to it operation. In the event that one laser fails in a transmitter, that failure affects only the laser corresponding to the wavelength originally allocated to that transmitter. According to an embodiment, the system returns to an operational condition by having the current source CS1 activate another laser so as to reassign that transmitter a new wavelength. Suitable means, such as the current source CS1, or another current source, assigns the wavelength of the failed laser to another transmitter whose laser at that wavelength has not failed.

Fabrication techniques for growing or otherwise integrating the individual elements of the transmitter TR1 of FIG. 1 onto a single substrate are well known, for example, from the aforementioned M. G. Young et al paper. According on embodiment of the present invention, the transmitter TR1 is constructed by using the same growth and fabrication processes, but with a mask layout suitable for realizing the structure of FIGS. 1 to 3. Generation of arrays of fixed frequency sources with high-throughput photolithographic printing processes is disclosed by J-M. Verdiell et al in "8-Wavelength DBR Laser Array Fabricated with a Single-Step Bragg Grating Printing Technique", in *IEEE Phot. Tech. Lett.* 5, pp. 619–621 (1993).

Another embodiment of the invention adapts the particular fabricating technique which appears in "Semiconductor Photonic Integrated Circuits" by Thomas L. Koch et al in *IEEE J. Quantum Electron.*, Vol. QE-27, pp. 641–653 (1991).

The invention overcomes the disadvantages of prior transmission applications using a set of isolated, discrete, fixed-frequency sources. In such instances the manufacturer would have had to "bin" the laser transmitters for each channel and provide for means to guarantee a suitable stock of all channels. Similarly, the system manufacturers must ensure maintenance of a stock of each channel and make a full supply of each channel readily available correctly to replace the appropriate channels for failures in the field. This backup need has a significant cost associated therewith. Furthermore, the invention overcomes the fact that such a prior art approach is not easily extendable to a wavelength division multiplexing switching application since each source can only achieve one wavelength channel.

The invention also overcomes the deficiencies of a tunable laser, including either a tunable laser that could access all wavelength channels, or a series of tunable lasers whose frequency ranges overlap to cover the desired frequency range. Such lasers lack a simple, reliable, and low cost wavelength stabilization technique. In these tunable devices, the wavelength is changed by applying a voltage, current, or some other tuning drive to change the optical characteristic of some part of the laser cavity. Once one achieves the means for providing the wavelength excursions larger than those achieved in conventional distributed feedback lasers, then suitable means must ensure that the calibration of wavelength versus the applied tuning drive remains robust against aging.

The invention also overcomes the disadvantages of modulating each laser in an array. Specifically, it overcomes the complexity of packaging necessary to provide for the high speed drive for each wavelength channel by offering a separate, high speed electrical drive capability to each laser or to each modulator. The invention further overcomes the substantial cost in size of such a transmitter module.

The present invention is particularly pertinent to applications that do not require, or do not regard as desirable, the simultaneous transmission of multiple independent data streams at each wavelength channel from a single module. This is true where the transmitter for a particular wavelength channel is remote from, or on a circuit board different from, a transmitter at a different wavelength channel. The invention recognizes that the difficulties and costs of providing each transmitter with a simultaneous high speed drive for each wavelength can be overcome.

While embodiments of the invention have been described in detail, it will be evident to those skilled in the art that the invention may be embodied otherwise without departing from its spirit and scope.

What is claimed is:

1. A wavelength-division multiplexed transmitter, comprising:
   a substrate;
   a plurality of individually actuable lasers integral with said substrate;
   an optical modulator integral with said substrate; and
   an optical combiner integral with said substrate and connecting each of said lasers with said modulator;
   said lasers each defining a different frequency exclusive of said combiner.

2. A transmitter as in claim 1, wherein said lasers, said modulator, and said optical combiner are grown on said substrate.

3. A transmitter as in claim 1, wherein said substrate is a semiconductor and said lasers, said modulator, and said optical combiner are grown on said substrate.

4. A transmitter as in claim 1, wherein said modulator includes an optical modulator element and an optical amplifier.

5. A transmitter as in claim 1, wherein said modulator includes an optical modulator element and an optical amplifier between said modulator element and said optical combiner.

6. A transmitter as in claim 1, wherein said modulator includes an optical amplifier and an optical modulator element between said amplifier and said optical combiner.

7. A transmitter as in claim 1, wherein said optical modulator includes an electroabsorption modulator element.

8. A transmitter as in claim 3, wherein said optical modulator element is an electroabsorption modulator.

9. A transmitter as in claim 1, wherein said lasers are each fixed frequency lasers for operation at respectively different frequencies.

10. A transmitter as in claim 1, further comprising actuating means connected to each of said lasers for energizing said lasers.

11. A transmitter as in claim 1, wherein said combiner is an in-plane diffraction region integrated in said substrate.

12. A transmitter as in claim 1, wherein said combiner is a waveguide y-branch tree.

13. A transmitter as in claim 1, wherein said lasers are distributed Bragg reflector lasers.

14. A transmitter as in claim 1, wherein said lasers are distributed feedback lasers.

15. A transmitter as in claim 1, wherein said modulator includes a directional coupler modulator element.

16. A transmitter as in claim 1, wherein said modulator includes a Mach-Zehnder modulator element.

17. A transmitter as in claim 1, wherein said combiner is a star coupler.

18. A transmitter as in claim 1, wherein said combiner is an N×1 star coupler.

* * * * *